(12) United States Patent
Chen et al.

(10) Patent No.: US 8,005,520 B2
(45) Date of Patent: Aug. 23, 2011

(54) MOBILE ELECTRONIC DEVICE

(75) Inventors: Hung-Ming Chen, Taoyuan County (TW); Pin-Chu Tsai, Chiayi (TW)

(73) Assignee: Foxconn Communication Technology Corp., Taoyuan County (TW)

( * ) Notice: Subject to any disclaimer, the term of this patent is extended or adjusted under 35 U.S.C. 154(b) by 619 days.

(21) Appl. No.: 12/124,423

(22) Filed: May 21, 2008

(65) Prior Publication Data

US 2009/0168338 A1 Jul. 2, 2009

(30) Foreign Application Priority Data

Dec. 28, 2007 (TW) ................................ 96222429 U

(51) Int. Cl.
*H04M 1/00* (2006.01)
(52) U.S. Cl. ............... 455/575.1; 455/575.2; 455/575.3; 455/575.4; 379/426; 379/426.1; 379/433.12; 379/437; 379/440
(58) Field of Classification Search ............... 455/757.4, 455/575.1–575.3, 571.2, 571.3; 379/433.01, 379/433.03, 433.04, 426, 426.1, 433.11, 379/433.12
See application file for complete search history.

(56) References Cited

U.S. PATENT DOCUMENTS

| | | | |
|---|---|---|---|
| 6,917,824 B2 * | 7/2005 | Kobayashi | 455/575.1 |
| 7,162,030 B2 * | 1/2007 | Bell et al. | 379/433.13 |
| 7,505,797 B2 * | 3/2009 | Kim | 455/575.1 |
| 7,738,656 B2 * | 6/2010 | Yoda | 379/433.01 |
| 2007/0135181 A1 * | 6/2007 | Ohki et al. | 455/575.1 |

* cited by examiner

*Primary Examiner* — Patrick N Edouard
*Assistant Examiner* — Julio Perez
(74) *Attorney, Agent, or Firm* — Steven M. Reiss

(57) ABSTRACT

A mobile electronic device includes a main body, a support frame, and a switch. When the support frame is in the first mode and used to support the main body, the main body is required to execute the first function by the support frame and the switch. For example, the first function is used to control the display and includes related functions of multimedia reproducing. In addition, when the support frame is in the second mode and used to support the main body, the main body is required to execute the second function by the support frame and the switch. For example, the second function is used to control the speaker and includes related functions. Whereby, the mobile electronic device includes different two modes to instinctively and automatically switch between video and audio files reproducing.

8 Claims, 6 Drawing Sheets

MOBILE ELECTRONIC DEVICE

BACKGROUND OF THE INVENTION

1. Field of the Invention

The present invention relates to a mobile electronic device, and in particular to a mobile electronic device which has a capability of automatically switching to reproduce audio/video files.

2. Description of Related Art

It is easy for users to carry mobile communication devices such as mobile phones which are usually equipped with function of instant messaging. The mobile communication devices are popular with our everyday lives. Recently, multimedia files such as video or audio files are booming so couples of mobile electronic device such as mentioned above mobile communication devices are usually equipped with functions of reproducing multimedia files such as video or audio files.

However, most mobile electronic devices such as smart phones, personal digital assistant (PDA), portable media players etc with functions of reproducing multimedia files have no support structures. Thus, users must hold mobile electronic devices between their thumbs so it does not fully meet users requirements. In addition, when users want to switch between video reproducing and audio reproducing, users need to push corresponding buttons to switch functions. In this light, it is not inconvenient for users to use mobile electronic devices so users are reluctant to purchase this kind of devices.

Thus, there is a need for a mobile electronic device which is built in instinctive manipulation to automatically switch between video and audio reproducing to overcome above disadvantages.

SUMMARY OF THE INVENTION

It is an object of the present invention to provide a mobile electronic device such as a mobile communication device which has a capability of automatically switching audio/video files reproducing. The mobile electronic device also includes different modes to instinctively and automatically switch between video and audio files reproducing. It is convenient for users to not only use function of multimedia file reproducing but also switch between video and audio files reproducing.

The present invention provides a mobile electronic device including a main body, a support frame, a switch, and the mobile electronic device also includes at least one function key.

The main body of the mobile electronic device has a capability of executing a first function and a second function. The support frame is pivotally connected with and used to support the main body so that the main body is supported by the support frame in a first mode and in a second mode.

The switch is coupled with the main body and the support frame so that the main body is switched to execute the first function or the second function.

When the support frame is in the first mode and used to support the main body, the main body is required to execute the first function by the support frame. In addition, when the support frame is in the second mode and used to support the main body, the main body is required to execute the second function by the support frame.

Furthermore, when the support frame is in the first mode and used to support the main body, the support frame makes the switch to input a first instruction so that the main body is required to execute the first function by the first instruction. In addition, when the support frame is in the second mode and used to support the main body, the support frame makes the switch to input a second instruction so that the main body is required to execute the second function by the second instruction.

A display is positioned at a first surface of the main body, and a speaker is positioned at a second surface of the main body. When the support frame is in the first mode, the display is oriented toward the users and when the support frame is in the second mode, the speaker is oriented toward the users. In addition, the first function is used to control the display and includes related functions of multimedia reproducing. The second function is used to control the speaker and includes related functions.

Therefore, according to the present invention, a mobile electronic device such as a mobile communication device is automatically switched to reproduce audio and video files because the mobile electronic device includes different modes and the switch is between and coupled with the main body and the support frame. Moreover, it is convenient for users to not only use function of multimedia file reproducing but also automatically switch between video and audio files reproducing.

BRIEF DESCRIPTION OF THE DRAWINGS

The present invention can be fully understood from the following detailed description and preferred embodiment with reference to the accompanying drawings, in which.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims.

Figure 1:
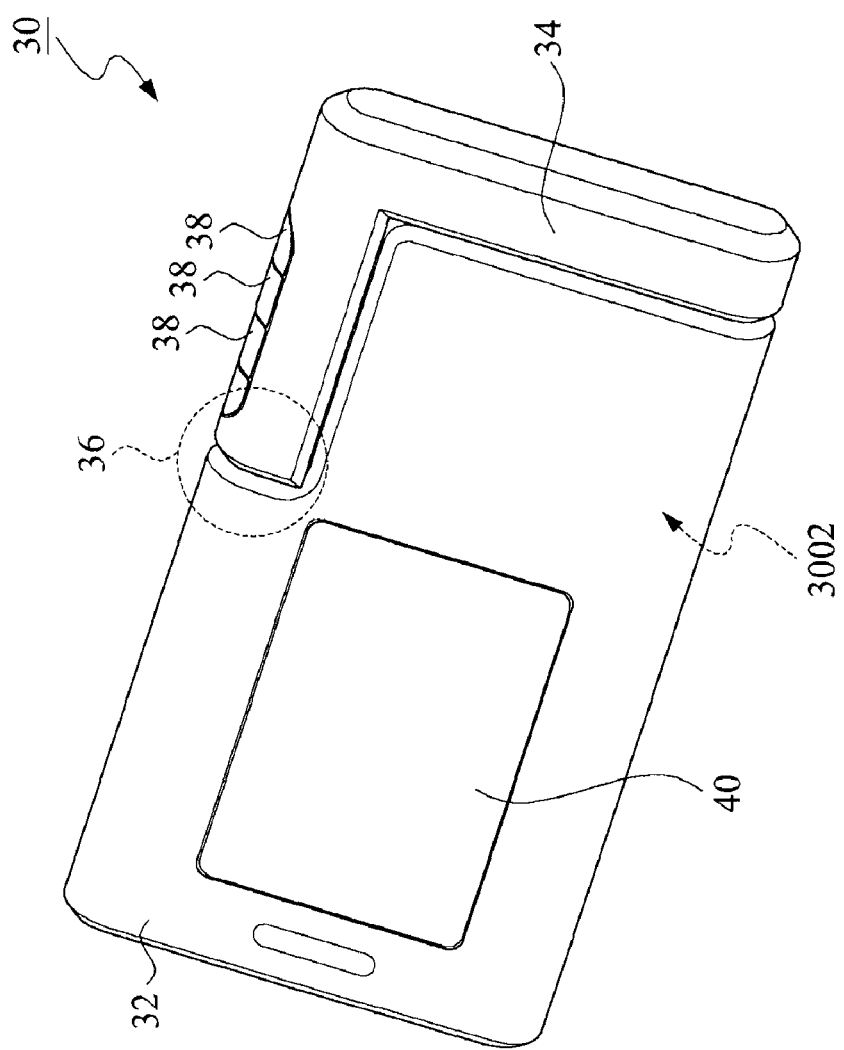
FIG. 1 is a plan view of a first surface of a mobile electronic device according to the present invention.
Figure 2:
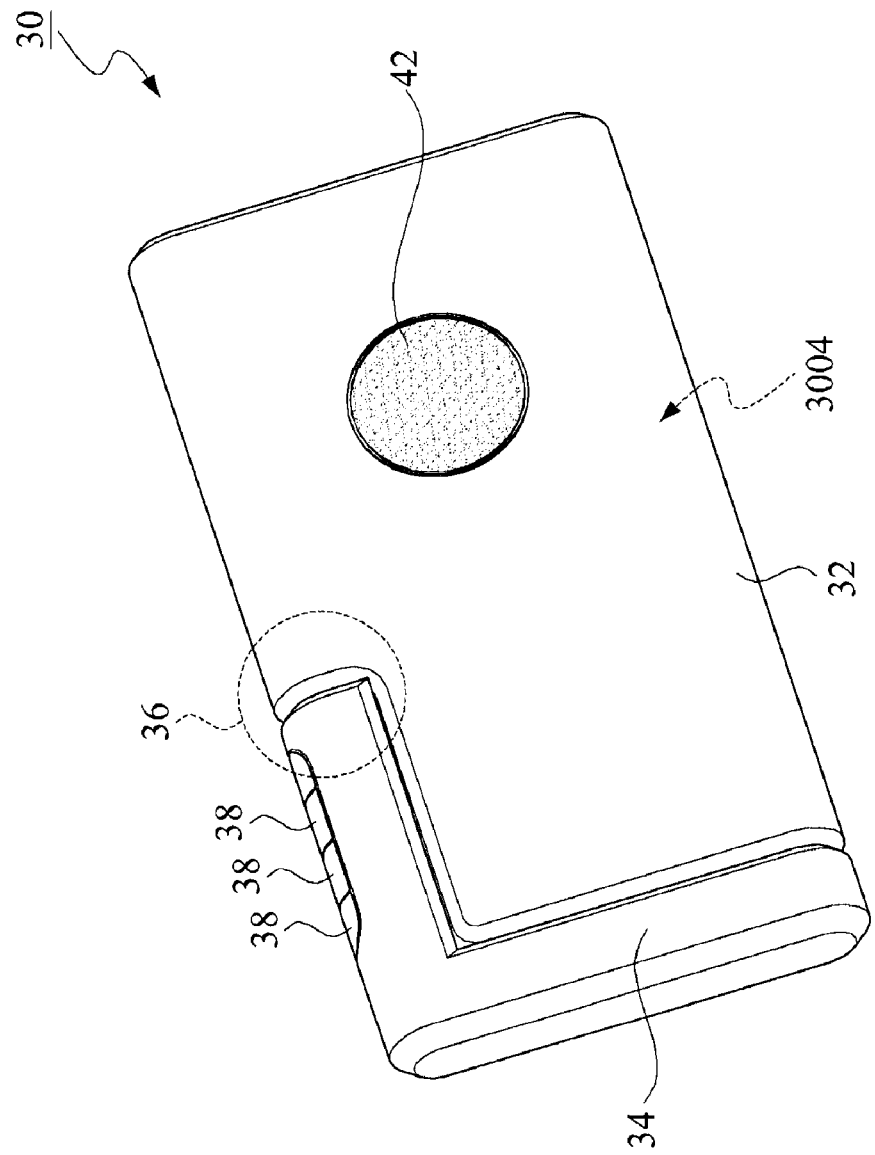
FIG. 2 is a plan view of a second surface of a mobile electronic device according to the present invention.

Referring to FIGS. 1 and 2, FIG. 1 illustrates a plan view of a first surface 3002 of a mobile electronic device 30 according to the present invention. FIG. 2 illustrates a plan view of a second surface 3004 of the mobile electronic device 30 according to the present invention. According to the present invention, the mobile electronic device 30 such as a mobile communication device has a capability of switching audio/video file reproducing. The mobile electronic device 30 also includes a main body 32, a support frame 34, a switch 36, and the mobile electronic device 30 also includes at least one function key 38.

As shown in FIG. 1, a display 40 is positioned at the first surface 3002 of the main body 32. As shown in FIG. 2, a speaker 42 is positioned at the second surface 3004 of the main body 32, and the second surface 3004 is opposite to the first surface 3002. Referring to FIGS. 1 and 2, there are four function keys 38 are positioned at upper surface of the support frame 34.

Figure 3:
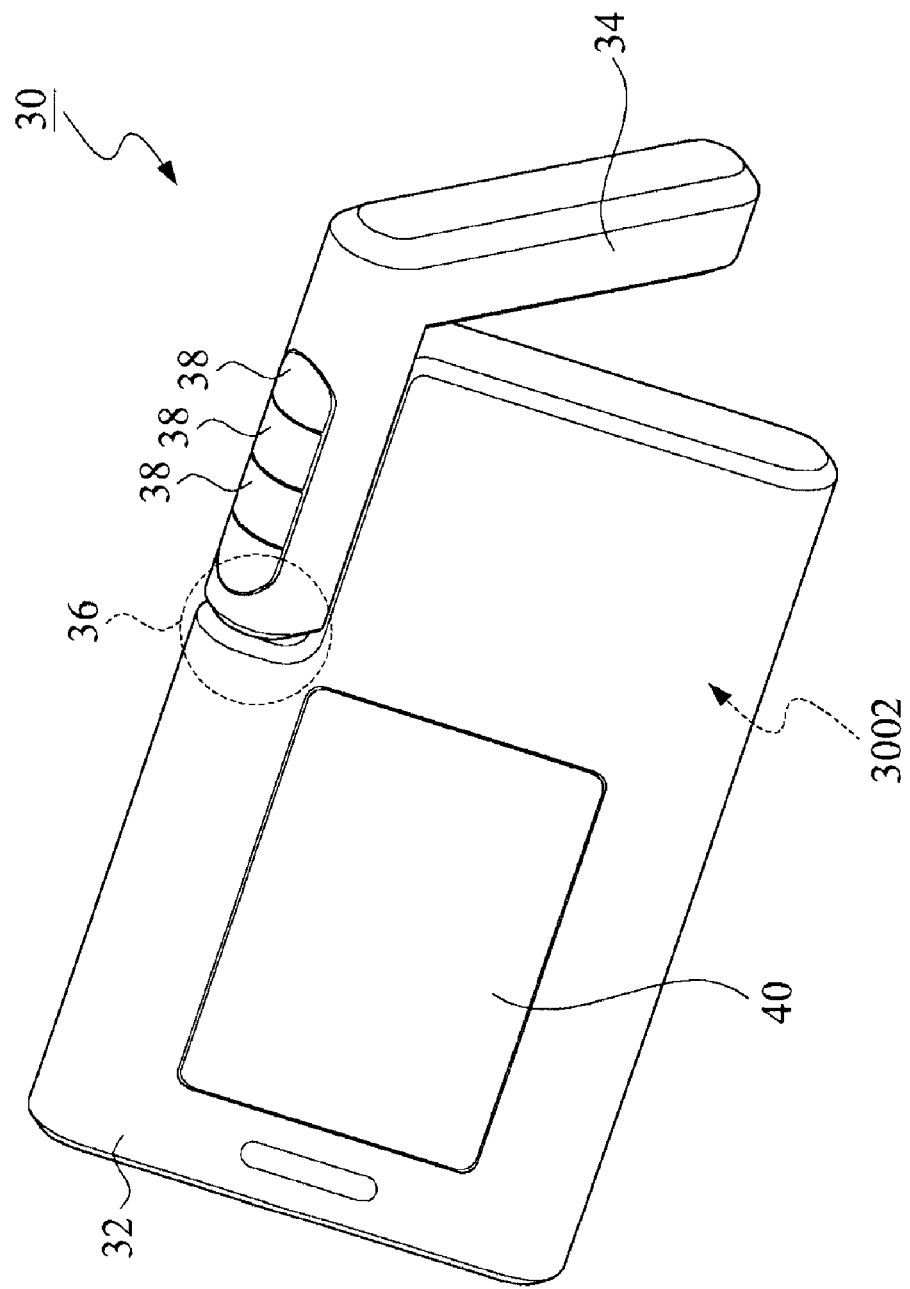
FIG. 3 is a perspective view of a mobile electronic device of the present invention, and the mobile electronic device being in a first mode.
Figure 4:
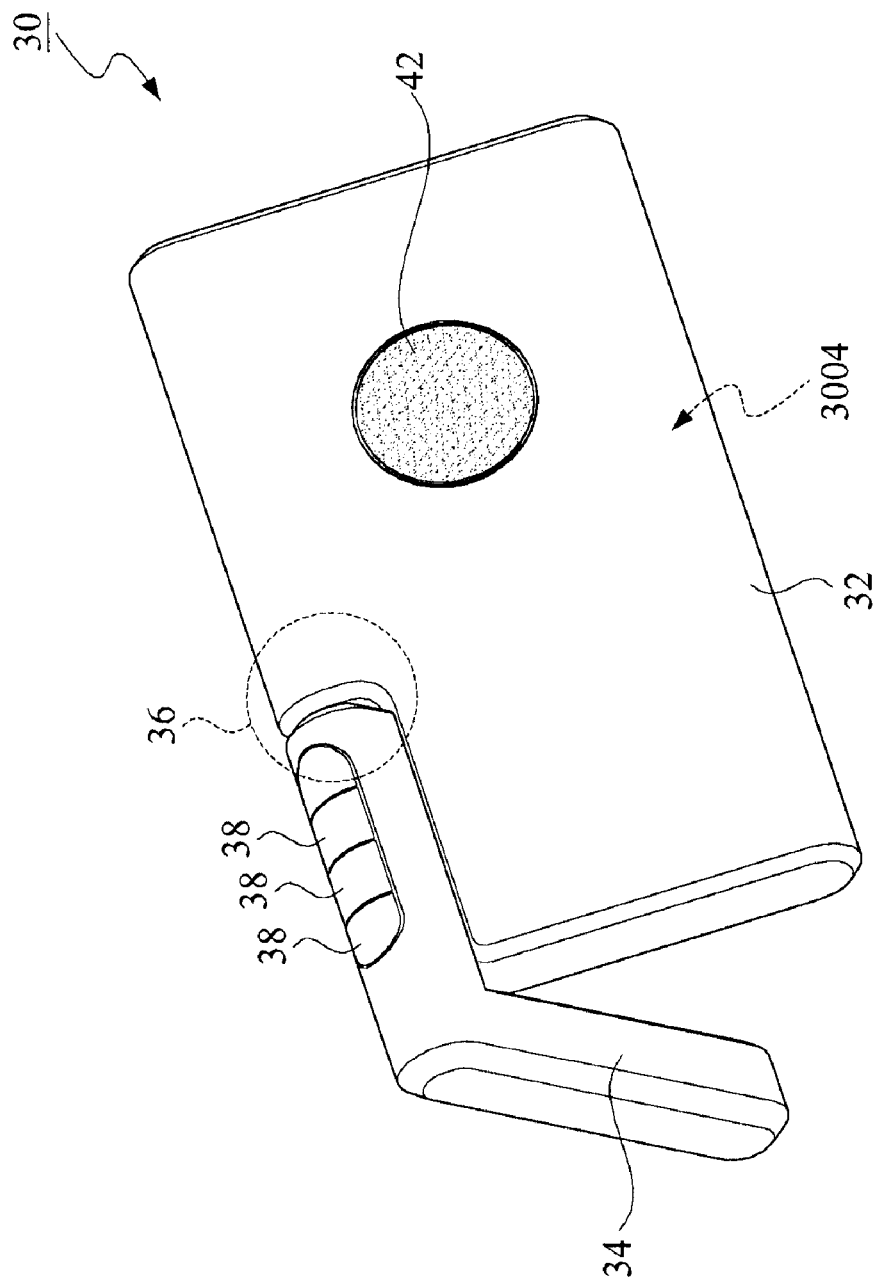
FIG. 4 is a perspective view of a mobile electronic device of the present invention, and the mobile electronic device being in a second mode.

Referring to FIGS. 3 and 4, FIG. 3 illustrates a perspective view of the mobile electronic device 30 of the present invention, and the mobile electronic device 30 is in a first mode. FIG. 4 illustrates a perspective view of a mobile electronic device 30 of the present invention, and the mobile electronic device 30 is in a second mode. The main body 32 has a capability of executing a first function and a second function. The support frame 34 is pivotally connected with and used to support the main body 32, and the support frame 34 is in a first mode or in a second mode. The top end of the support frame 34 is pivotally connected with the main body 32, and the bottom end of the support frame 34 is used to support the main body 32.

When the support frame 34 is in the first mode and the main body 32 is obliquely orientated toward users by the support frame 34 so that the main body 32 is required to execute the first function. The first function is used to control the display 40 and includes related functions of multimedia reproducing. When the support frame 34 is in the second mode, the speaker 42 is oriented toward the users so that the main body 32 is required to execute the second function. The second function is used to control the speaker 42 and includes related functions.

The switch 36 is positioned between and coupled with the main body 32 and the support frame 34 so that the main body 32 is switched to execute the first function and the second function. As shown in FIGS. 3 and 4, the switch 36 is positioned at the pivotally connected position of the support frame 34 so user cannot find the switch 36. With respect to FIGS. 5 and 6, detailed description of the switch 36 is in the following.

When the support frame 34 is in the first mode and used to support the main body 32, the support frame 34 makes the switch 36 switch the main body 32 to execute the first function. When the support frame 34 is in the second mode and used to support the main body 32, the support frame 34 makes the switch 36 switch the main body 32 to execute the second function.

The function keys 38 are positioned at upper surface of the support frame 34 or surface of the main body 32. When support frame 34 is in first mode and used to support the main body 32, the support frame 34 makes the switch 36 switch the main body 32 and input a first instruction so that the main body 32 is required to execute the first function by the first instruction. In addition, when the support frame 34 is in the second mode and used to support the main body 32, the support frame 34 makes the switch 36 switch the function key 38 and input a second instruction so that the main body 32 is required to execute the second function by the second instruction.

Furthermore, when the support frame 34 is in the first mode and the display 40 is obliquely orientated toward users, the first instruction of the function key 38 is used to control the display 40 and includes related instructions of multimedia reproducing such as PLAY/STOP, Fast Forward, Rewind etc. When the support frame 34 is in the second mode, the speaker 42 is oriented toward the users so that the main body 32 is required to execute the second function. The second instruction of the function key 38 is used to control the speaker 42 and includes related functions such as sound on/off, volume etc.

Figure 5:
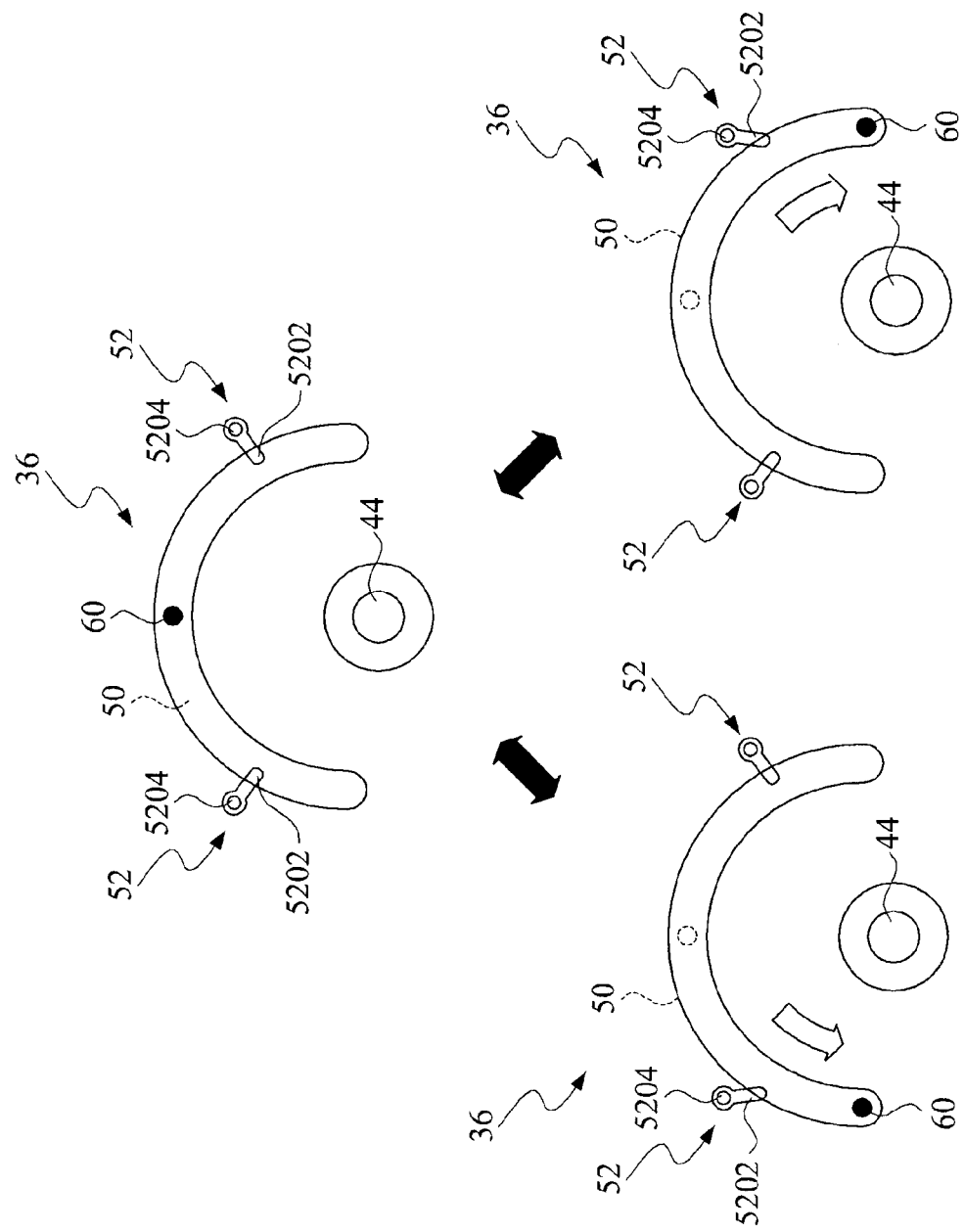
FIG. 5 is a perspective view of a mobile electronic device according to the first embodiment of the present invention.

Referring to FIG. 5, it illustrates a perspective view of the mobile electronic device 30 according to the first embodiment of the present invention. The support frame 34 is pivotally connected with a shaft 44 of the main body 32. As described above, the switch 36 of the mobile electronic device 30 includes an arcuate housing 50, two sensors 52, and a stop rib 60.

The arcuate housing 50 is positioned near where the main body 32 and the support frame 34 are pivotally connected, and the arcuate housing 50 is positioned at one surface of the main body 32 and adjacent to the support frame 34.

The two sensors 52 are pivotally connected with the main body 32 by corresponding pins 5204, and the two sensors 52 are respectively positioned at opposite positions of the arcuate housing 50. Rods 5202 of the two sensors 52 are respectively extended into the arcuate housing 50.

The stop rib 60 is positioned at the support frame 34 and near where the main body 32 and the support frame 34 are pivotally connected. The stop rib 60 traverse extends from the support frame 34 and toward the arcuate housing 50.

When the support frame 34 is in the first mode (shown in left bottom drawing of FIG. 5) and the stop rib 60 is used to rotate the rods 5202 of one of the two sensors 52, the main body 32 is switched and required to execute the first function. When the support frame 34 in the second mode (shown in right bottom drawing of FIG. 5) and the stop rib 60 is used to rotate the rods 5202 of the other of the two sensors 52, the main body 32 is switched and required to execute the second function.

As described above, the switch 36 has alternate structures. Referring to FIG. 5, both the arcuate housing 50 and the two sensors 52 are positioned at the support frame 34, and the stop rib 60 is positioned at the main body 32. In this light, when the support frame 34 is in the first mode and the stop rib 60 moves within the arcuate housing 50 to rotate the rods 5202 of one of the two sensors 52, the main body 32 is switched and required to execute the first function. When the support frame 34 in the second mode and the stop rib 60 moves within the arcuate housing 50 to rotate the rods 5202 of the other of the two sensors 52, the main body 32 is switched and required to execute the second function.

Figure 6:
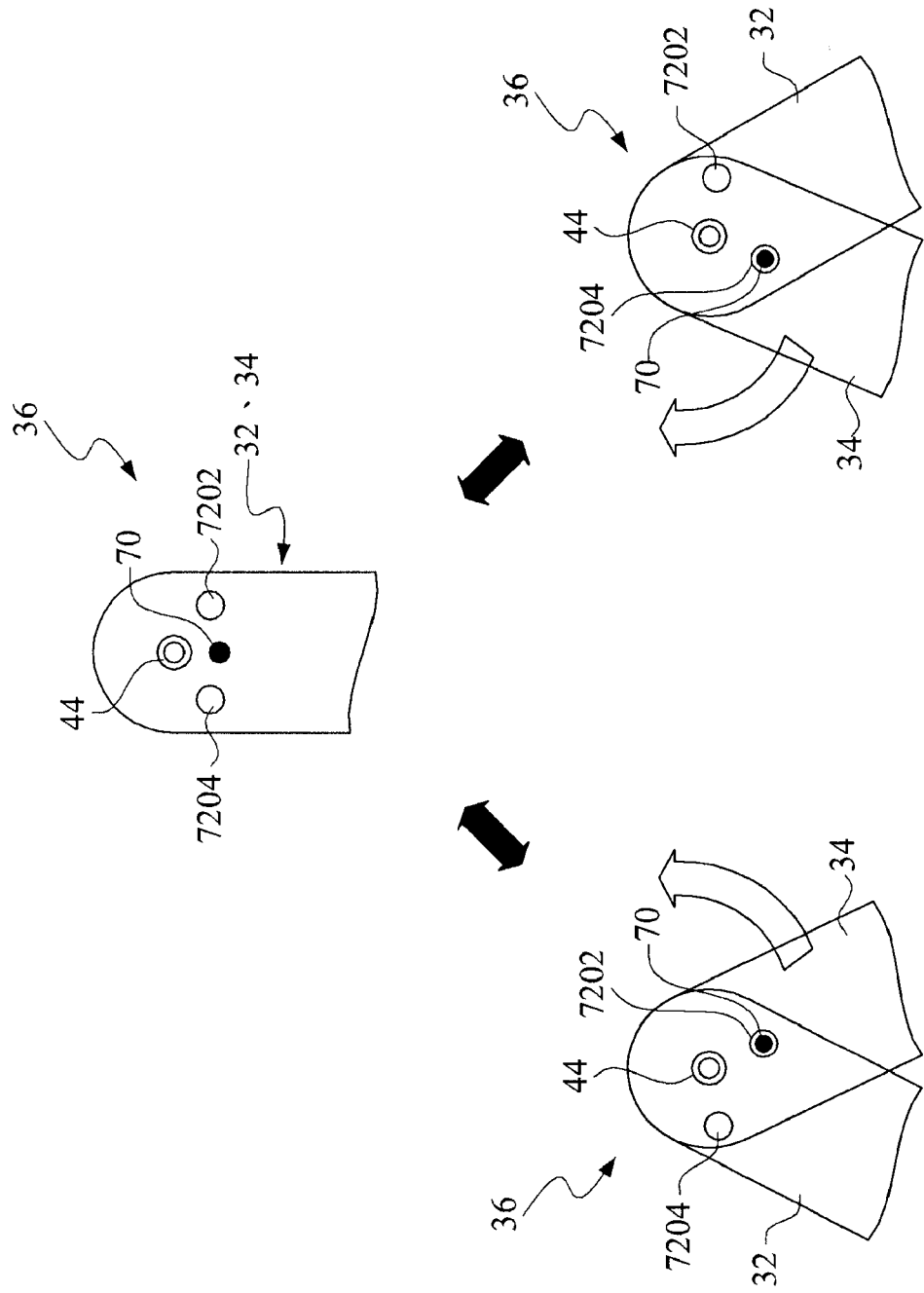
FIG. 6 is a perspective view of a mobile electronic device according to the second embodiment of the present invention.

Referring to FIG. 6, it shows a perspective view of the switch 36 of the mobile electronic device according to the second embodiment of the present invention. As described above, the switch 36 can be a reed switch. The reed switch includes a magnet 70, a first reed sensor 7202, and a second reed sensor 7204.

The magnet 70 is positioned at the support frame 34 and near where the main body 32 is pivotally connected with the support frame 34.

The first reed sensor 7202 corresponds with the magnet 70 and is positioned at the main body 32 and adjacent to one side of the support frame 34 when the support frame 34 is in the first mode. The second reed sensor 7204 corresponds with the magnet 70 and is positioned at the main body 32 and adjacent to the other side of the support frame 34 when the support frame 34 is in the second mode.

In addition, when the support frame 34 is in the first mode (shown in left bottom drawing of FIG. 6) and the magnet 70 moves closer to the first reed sensor 7202, the main body 32 is switched and required to execute the first function. When the support frame 34 is in the second mode (shown in right bottom drawing of FIG. 6) and the magnet 70 moves closer to the second reed sensor 7204, the main body 32 is switched and required to execute the second function.

Therefore, the present invention provides the mobile electronic device 30 such as a mobile communication device which has a capability of switching audio/video file reproducing. The mobile electronic device 30 also includes different modes to instinctively and automatically switch between video and audio files reproducing. The switch 36 is coupled with the main body 32 and the support frame 34 so that the main body 32 is switched and required to execute the first function and the second function. It is convenient for users to not only use function of multimedia file reproducing but also switch between video and audio files reproducing.

While the invention has been described with reference to the preferred embodiments, the description is not intended to be construed in a limiting sense. It is therefore contemplated that the appended claims will cover any such modifications or embodiments as may fall within the scope of the invention defined by the following claims and their equivalents.

What is claimed is:

1. A mobile electronic device, comprising:
   a main body, having a capability of executing a first function and a second function;
   a support frame, pivotally connected with and used to support the main body when the support frame being in a first mode and in a second mode; and
   a switch, coupled with the main body and the support frame so that the main body is switched and is required to execute the first function and the second function, the switch comprising:
   an arcuate housing, positioned at one surface of the main body and near the support frame;
   two sensors, positioned at the main body and respectively positioned at opposite positions of the arcuate housing, and rods respectively received at the arcuate housing; and
   a stop rib, positioned at the support frame and traverse extending from the support frame and toward the arcuate housing;
   wherein the main body is switched and required to execute the first function when the support frame is in the first mode and the stop rib is used to rotate the rods of one of the two sensors, and the main body is switched and required to execute the second function when the support frame in the second mode and the stop rib is used to rotate the rods of the other of the two sensors;
   wherein the main body is required to execute the first function via the switch triggered in a first direction by the support frame when the support frame is in the first mode and used to support the main body, and the main body is required to execute the second function via the switch triggered in a second direction opposite to the first direction by the support frame when the support frame is in the second mode and is used to support the main body.

2. The mobile electronic device as claimed in claim 1, further comprising at least one function key, and the switch required to input a first instruction by the support frame so that the main body is required to execute the first function by the first instruction when the support frame being in the first mode and used to support the main body, and the switch required to input a second instruction by the support frame so that the main body is required to execute the second function by the first instruction when the support frame being in the second mode and used to support the main body.

3. The mobile electronic device as claimed in claim 2, wherein a display is positioned at a first surface of the main body, a speaker is positioned at a second surface of the main body and the second surface is opposite to the first surface, in which the display is oriented toward the users when the support frame is in the first mode, the speaker is oriented toward the users when the support frame is in the second mode, the first function is used to control the display and the second function is used to control the speaker.

4. The mobile electronic device as claimed in claim 2, wherein the function keys are positioned at upper surface of the support frame.

5. The mobile electronic device as claimed in claim 2, wherein the function keys are positioned at surface of the main body.

6. The mobile electronic device as claimed in claim 1, wherein the support frame is pivotally connected with the main body.

7. The mobile electronic device as claimed in claim 1, wherein the switch is a reed switch and further comprises:
   a magnet, positioned at the support frame and near one side of the main body;
   a first reed sensor, corresponding with the magnet and positioned at the main body and near one side of the support frame when the support frame is in the first mode; and
   a second reed sensor, corresponding with the magnet and positioned at the main body and near the other side of the support frame when the support frame is in the second mode;
   wherein the magnet moves closer to the first reed sensor so that the main body is switched and required to execute the first function when the support frame is in the first mode, and the magnet moves closer to the second reed sensor so that the main body is switched and required to execute the second function when the support frame in the second mode.

8. The mobile electronic device as claimed in claim 1, wherein the mobile electronic device is a mobile communication device.

* * * * *